(12) United States Patent
Nitta

(10) Patent No.: US 11,295,934 B2
(45) Date of Patent: Apr. 5, 2022

(54) MEMBER FOR SEMICONDUCTOR MANUFACTURING DEVICE

(71) Applicant: TOTO LTD., Kitakyushu (JP)

(72) Inventor: Yasutaka Nitta, Kitakyushu (JP)

(73) Assignee: Toto Ltd., Fukuoka (JP)

( * ) Notice: Subject to any disclaimer, the term of this patent is extended or adjusted under 35 U.S.C. 154(b) by 233 days.

(21) Appl. No.: 16/127,923

(22) Filed: Sep. 11, 2018

(65) Prior Publication Data
US 2019/0027343 A1    Jan. 24, 2019

Related U.S. Application Data

(63) Continuation of application No. PCT/JP2017/032851, filed on Sep. 12, 2017.

(30) Foreign Application Priority Data

Sep. 13, 2016  (JP) .............................. JP2016-178671
Sep. 11, 2017  (JP) .............................. JP2017-173746

(51) Int. Cl.
 *H01J 37/32*  (2006.01)
 *C23C 24/04*  (2006.01)

(52) U.S. Cl.
 CPC ........ *H01J 37/32495* (2013.01); *C23C 24/04* (2013.01); *H01J 2237/0213* (2013.01)

(58) Field of Classification Search
 CPC ........ H01J 37/32495; H01J 2237/0213; C23C 24/04
 See application file for complete search history.

(56) References Cited

U.S. PATENT DOCUMENTS

| | | | |
|---|---|---|---|
| 2006/0099241 A1* | 5/2006 | Saito .................... | A61F 13/023 424/447 |
| 2008/0276865 A1* | 11/2008 | Nishimizu .......... | H01L 21/6831 118/500 |
| 2010/0079546 A1* | 4/2010 | Takahashi .............. | B41J 2/1631 347/45 |
| 2012/0037596 A1* | 2/2012 | Eto .................... | H01J 37/32449 216/67 |
| 2012/0040132 A1* | 2/2012 | Eto ........................ | C22C 21/00 428/131 |
| 2017/0152189 A1 | 6/2017 | Iwasawa | |

FOREIGN PATENT DOCUMENTS

JP    2012-057251 A    3/2012

* cited by examiner

*Primary Examiner* — Tong Guo
(74) *Attorney, Agent, or Firm* — Carrier Blackman & Associates, P.C.; Joseph P. Carrier; William D. Blackman

(57) ABSTRACT

According to one embodiment, a member for a semiconductor manufacturing device includes an alumite base material including a concavity, and a first layer formed on the alumite base material and including an yttrium compound. The first layer includes a first region, and a second region provided in the concavity and located between the first region and the alumite base material. An average particle diameter in the first region is shorter than an average particle diameter in the second region.

5 Claims, 20 Drawing Sheets

UNIT(nm)

| REGION | AVERAGE PARTICLE DIAMETER | MAXIMUM VALUE | MINIMUM VALUE | NUMBER N |
|---|---|---|---|---|
| A-1 | 10 | 24 | 7 | 101 |
| A-2 | 14 | 25 | 11 | 100 |
| B-1 | 19 | 25 | 13 | 100 |
| B-2 | 16 | 28 | 10 | 100 |
| C | 20 | 40 | 13 | 100 |
| D | 39 | 77 | 11 | 100 |
| E | 43 | 75 | 14 | 100 |

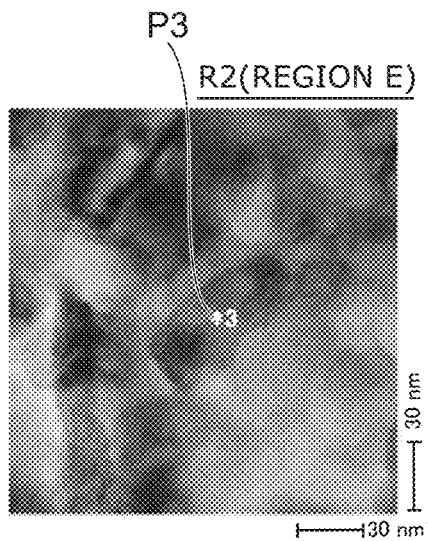
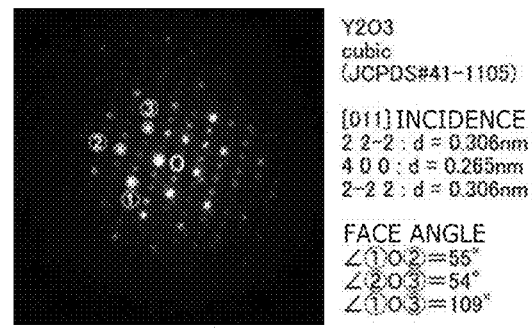
FIG. 8A
FIG. 8B
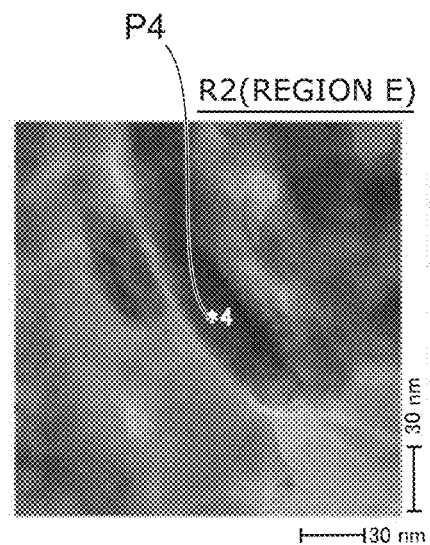
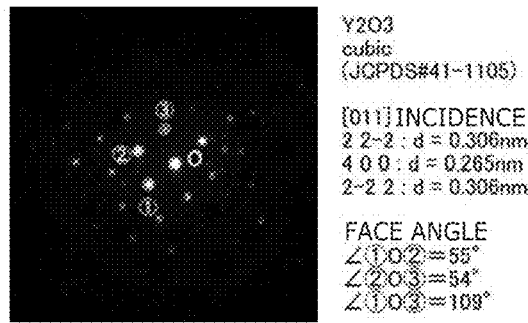
FIG. 8C
FIG. 8D

|  | VIEW 1 | VIEW 2 | RESULT |
|---|---|---|---|
| REGION A | MONOCLINIC CRYSTAL | MONOCLINIC CRYSTAL | MONOCLINIC PREDOMINANT |
| REGION B | MONOCLINIC CRYSTAL | MONOCLINIC CRYSTAL | MONOCLINIC PREDOMINANT |
| REGION C | MONOCLINIC CRYSTAL | CUBIC CRYSTAL | MIXED CRYSTAL STRUCTURE |
| REGION D | CUBIC CRYSTAL | CUBIC CRYSTAL | CUBIC PREDOMINANT |
| REGION E | CUBIC CRYSTAL | CUBIC CRYSTAL | CUBIC PREDOMINANT |
| REGION F | CUBIC CRYSTAL | CUBIC CRYSTAL | CUBIC PREDOMINANT |

FIG. 9

|  | CRYSTALLITE SIZE (nm) | |
| --- | --- | --- |
|  | CUBIC CRYSTAL | MONOCLINIC CRYSTAL |
| SAMPLE 1 | 8 | 5 |
| SAMPLE 2 | 10 | 5 |
| SAMPLE 3 | 21 | 10 |
| SAMPLE 4 | 17 | 12 |
| SAMPLE 5 | 39 | 19 |

FIG. 10

| | AREA RATIO OF SPARSE REGION (%) | |
|---|---|---|
| | VIEW 1 | VIEW 2 |
| REGION A | 0.4 | 1.7 |
| REGION C | 0.3 | 0.2 |
| REGION D | 3.5 | 2.0 |
| REGION E | 9.1 | 7.4 |
| REGION F | 9.3 | 7.0 |

R1(REGION A) : VIEW 1

R1(REGION A) : VIEW 2

R2(REGION E) : VIEW 1

R2(REGION E) : VIEW 2

|  | WO/WB |
|---|---|
| No.1 | 2.7 |
| No.2 | 4.1 |
| No.3 | 3.7 |
| No.4 | 4.4 |
| No.5 | 3.3 |
| No.6 | 2.7 |
| No.7 | 7.7 |
| No.8 | 2.7 |
| No.9 | 3.3 |
| No.10 | 2.7 |
| No.11 | 2.7 |
| No.12 | 9.7 |
| No.13 | 3.3 |
| No.14 | 1.6 |
| No.15 | 4.9 |
| No.16 | 3.3 |
| No.17 | 3.6 |
| No.18 | 3.0 |
| No.19 | 2.9 |
| No.20 | 3.6 |
| No.21 | 3.3 |
| No.22 | 3.3 |
| No.23 | 1.1 |
| No.24 | 1.4 |
| No.25 | 2.0 |

| MAXIMUM VALUE | 9.7 |
|---|---|
| MINIMUM VALUE | 1.1 |

FIG. 17

|  | $\theta 1 (°)$ |
|---|---|
| No.1 | 45 |
| No.2 | 55 |
| No.3 | 82 |
| No.4 | 38 |
| No.5 | 48 |
| No.6 | 41 |
| No.7 | 59 |
| No.8 | 35 |
| No.9 | 66 |
| No.10 | 50 |
| No.11 | 19 |
| No.12 | 89 |
| No.13 | 39 |
| No.14 | 10 |
| No.15 | 65 |
| No.16 | 31 |
| No.17 | 73 |
| No.18 | 27 |
| No.19 | 25 |
| No.20 | 52 |
| No.21 | 31 |
| No.22 | 31 |
| No.23 | 20 |
| No.24 | 25 |
| No.25 | 27 |

| | |
|---|---|
| MAXIMUM VALUE | 89 |
| MINIMUM VALUE | 10 |

FIG. 18

| | R(μm) |
|---|---|
| No.1 | 0.5 |
| No.2 | 5.4 |
| No.3 | 11.2 |
| No.4 | 1.7 |
| No.5 | 2.1 |
| No.6 | 2.1 |
| No.7 | 21.0 |
| No.8 | 7.5 |
| No.9 | 11.1 |
| No.10 | 2.1 |
| No.11 | 14.6 |
| No.12 | 0.4 |
| No.13 | 20.5 |
| No.14 | 3.3 |
| No.15 | 13.5 |
| No.16 | 1.7 |
| No.17 | 1.7 |
| No.18 | 8.9 |
| No.19 | 6.5 |
| No.20 | 3.3 |
| No.21 | 0.4 |
| No.22 | 12.0 |
| No.23 | 10.4 |
| No.24 | 2.1 |
| No.25 | 0.8 |
| MINIMUM VALUE | 0.4 |

FIG. 19

MEMBER FOR SEMICONDUCTOR MANUFACTURING DEVICE

CROSS-REFERENCE TO RELATED APPLICATIONS

This is a continuation application of International Application PCT/JP2017/032851, filed on Sep. 12, 2017. This application is also based upon and claims the benefit of priority from Japanese Patent Application No. 2016-178671, filed on Sep. 13, 2016, and Japanese Patent Application No. 2017-173746, filed on Sep. 11, 2017; the entire contents of which are incorporated herein by reference.

FIELD OF THE INVENTION

Aspects of the invention relate generally to a member for a semiconductor manufacturing device.

BACKGROUND OF THE INVENTION

A semiconductor manufacturing device is used for processing such as dry etching, sputtering and CVD (Chemical Vapor Deposition) or the like in a chamber in a manufacturing process of a semiconductor device. In this chamber, particles may be generated from a workpiece or an inner wall of the chamber or the like. Since the particles cause decrease of yield of the manufactured semiconductor device, the particles are desired to be reduced.

In order to reduce the particles, plasma resistance is required for the chamber and the member for semiconductor manufacturing device used around the chamber. Then, a method of coating the surface of the member for the semiconductor manufacturing device with a coating (layer) excellent in plasma resistance is used. For example, a member having an yttria sprayed film formed on the surface of the base material is used. However, cracking and peeling may occur in the sprayed film, and durability is not sufficient. Since peeling of the coating and shedding from the coating cause particles to occur, it is required to suppress the peeling of the coating from the base material. On the contrary, JP 2005-158933 A (Kokai) discloses a semiconductor or a material of a liquid crystal manufacturing device based on a ceramic film formed by an aerosol deposition method.

Recently, refinement of a semiconductor device is progressed and control of particles at a nanometer level is required.

SUMMARY OF THE INVENTION

The first invention is a member for a semiconductor manufacturing device including: an alumite base material including a concavity; and a first layer formed on the alumite base material and including an yttrium compound, the first layer including a first region, and a second region provided in the concavity and located between the first region and the alumite base material, an average particle diameter in the first region being shorter than an average particle diameter in the second region.

According to the member for the semiconductor manufacturing device, the average particle diameter of the first region near a surface is smaller than the average particle diameter of the second region. That is, the first layer has a dense structure in the first region on the surface side of the member for the semiconductor manufacturing device. Thereby, a plasma resistance can be improved. The first layer has a sparse structure in the second region in the concavity in comparison with the first region. Since the second region has a sparse structure, a stress generated near the interface of the first layer in the concavity and the alumite base material can be released and relaxed. Thereby, peeling off of the first layer from the alumite base material can be suppressed. From the above, particles can be reduced.

The second invention is the member for the semiconductor manufacturing device of the first invention, wherein the average particle diameter of the first region is not less than 10 nanometers and not more than 19 nanometers, and the average particle diameter of the second region is not less than 20 nanometers and not more than 43 nanometers.

According to the member for the semiconductor manufacturing device, the first layer has a dense structure in the first region on the surface side of the member for the semiconductor manufacturing device. Thereby, the plasma resistance can be improved. The first layer has a sparse structure in the second region in the concavity. Thereby, the stress generated near the interface of the first layer in the concavity and the alumite base material can be relaxed, and peeling off of the first layer from the alumite base material can be suppressed. From the above, the particles can be reduced.

The third invention is a member for a semiconductor manufacturing device including: an alumite base material including a concavity; and a first layer formed on the alumite base material and including yttrium oxide, the first layer including a first region, and a second region provided in the concavity and located between the first region and the alumite base material, the first region having a monoclinic crystal as a main phase, and the second region having a cubic crystal as a main phase.

According to the member for the semiconductor manufacturing device, crystal particles of the first region are distorted in comparison with crystal particles of the second region. That is, the crystal particles of the first region have a collapsed shape in comparison with the crystal particles of the second region. Therefore, an yttrium oxide layer has a dense structure on the surface side of the member for the semiconductor manufacturing device. Thereby, the plasma resistance can be improved. The first layer has a sparse structure in the second region in the concavity in comparison with the first region. Since the second region has the sparse structure, the stress generated near the interface of the first layer in the concavity and the alumite base material can be relaxed, and peeling off of the first layer from the alumite base material can be suppressed. From the above, the particles can be reduced.

The fourth invention is a member for a semiconductor manufacturing device including: an alumite base material including a concavity; and a first layer formed on the alumite base material and including yttrium oxide, a crystallite size of a cubic phase in the first layer being not less than 8 nanometers and not more than 39 nanometers, and a crystallite size of an orthorhombic phase in the first layer being not less than 5 nanometers and not more than 19 nanometers.

According to the member for the semiconductor manufacturing device, a crystallite size of a monoclinic phase in the first layer is small in comparison with a crystallite size of the cubic phase in the first layer. That is, the monoclinic phase has a dense structure. Since the first layer has the dense monoclinic phase, the plasma resistance can be improved and the particles can be reduced.

The fifth invention is a member for a semiconductor manufacturing device including: an alumite base material including a concavity; and a first layer formed on the alumite base material and including an yttrium compound, the first layer including a first region, and a second region provided in the concavity and located between the first region and the alumite base material, the first region being denser than the second region.

According to the member for the semiconductor manufacturing device, the first layer has the dense structure in the first region on the surface side of the member for the semiconductor manufacturing device. Thereby, the plasma resistance can be improved. The first layer has the sparse structure in the second region in the concavity. Thereby, the stress generated near the interface of the first layer in the concavity and the alumite base material can be relaxed and peeling off of the first layer from the alumite base material can be suppressed. From the above, the particles can be reduced.

The sixth invention is the member for the semiconductor manufacturing device of the fifth invention, wherein a ratio of an area of a sparse region in a cross section of the first region to an area of the cross section of the first region is not less than 0.4% and not more than 1.7%, and a ratio of an area in a sparse region in a cross section of the second region to an area of the cross section of the second region is not less than 2.0%.

According to the member for the semiconductor manufacturing device, the first layer has the dense structure in the first region on the surface side of the member for the semiconductor manufacturing device. Thereby, the plasma resistance can be improved. The first layer has the sparse structure in the second region in the concavity. Thereby, the stress generated near the interface of the first layer in the concavity and the alumite base material can be relaxed, and peeling off of the first layer from the alumite base material can be suppressed. From the above, the particles can be reduced.

The seventh invention is a member for a semiconductor manufacturing device including: an alumite base material including a concavity; and a first layer formed on the alumite base material and including an yttrium compound, the first layer including a first region, and a second region provided in the concavity and located between the first region and the alumite base material, the concavity including a first portion provided with the first region and a second portion provided with the second region, and a width of the second portion being narrower than a width of the first portion in a cross section along a stacking direction.

According to the member for the semiconductor manufacturing device, a width of the concavity can be suppressed from changing rapidly, and the stress generated near the interface of the first layer in the concavity and the alumite base material can be suppressed from being concentrated. Therefore, the first layer can be suppressed from peeling off from the alumite base material, and the particles can be reduced.

The eighth invention is the member for the semiconductor manufacturing device of the seventh invention, wherein the second portion has a bottom surface along a plane perpendicular to the stacking direction, and a ratio of an opening width of the first portion to a width of the bottom surface is not less than 1.1 times in the cross section.

According to the member for the semiconductor manufacturing device, a width of the concavity can be suppressed from changing rapidly, and the stress generated near the interface of the first layer in the concavity and the alumite base material can be suppressed from being concentrated. Therefore, the first layer can be suppressed from peeling off from the alumite base material, and the particles can be reduced.

The ninth invention is the member for the semiconductor manufacturing device of the seventh or eighth invention, wherein the first layer has a surface opposite to a surface contacting the alumite base material, and a width of the concavity in the cross section becomes narrower as it goes away from the surface.

According to the member for the semiconductor manufacturing device, the stress generated near the interface of the first layer in the concavity and the alumite base material can be suppressed from being concentrated.

The tenth invention is the member for the semiconductor manufacturing device of the seventh invention, wherein an opening of the concavity has a first end portion and a second end portion separated each other in the cross section, the second portion has a bottom surface along a plane perpendicular to the stacking direction, and an angle made by a straight line connecting the first end portion and the second end portion and a straight line connecting the first end portion and the bottom surface in the shortest length in the cross section is not less than 10° and not more than 89°.

According to the member for the semiconductor manufacturing device, a width of the concavity can be suppressed from changing rapidly, and the stress generated near the interface of the first layer in the concavity and the alumite base material can be suppressed from being concentrated. Therefore, the first layer can be suppressed from peeling off from the alumite base material, and the particles can be reduced.

The eleventh invention is the member for the semiconductor manufacturing device of one of the seventh to tenth inventions, wherein a boundary of the first layer in the concavity and the alumite base material is curved in the cross section.

According to the member for the semiconductor manufacturing device, a discontinuous change of the boundary of the first layer in the concavity and the alumite base material can be suppressed, and the stress generated near the interface of the first layer in the concavity and the alumite base material can be suppressed from being concentrated. Therefore, the first layer can be suppressed from peeling off from the alumite base material.

The twelfth invention is the member for the semiconductor manufacturing device of one of the seventh to eleventh inventions, wherein a boundary of the first layer in the concavity and the alumite base material has a curvature in the cross section.

According to the member for the semiconductor manufacturing device, a discontinuous change of the boundary of the first layer in the concavity and the alumite base material can be suppressed, and the stress generated near the interface of the first layer in the concavity and the alumite base material can be suppressed from being concentrated. Therefore, the first layer can be suppressed from peeling off from the alumite base material.

The thirteenth invention is the member for the semiconductor manufacturing device of one of the seventh to twelfth inventions, wherein a curvature radius of a boundary of the first layer in the concavity and the alumite base material is not less than 0.4 micrometers.

According to the member for the semiconductor manufacturing device, a width of the concavity can be suppressed from changing rapidly, and the stress generated near the interface of the first layer in the concavity and the alumite base material can be suppressed from being concentrated.

Therefore, the first layer can be suppressed from peeling off from the alumite base material, and the particles can be reduced.

BRIEF DESCRIPTION OF THE DRAWINGS

FIG. 8A to FIG. 8D are photographs illustrating structure analysis of crystal particles in the first layer;

FIG. 9 is a table showing a crystal structure of crystal particles in the first layer;

FIG. 10 is a table showing a crystal size in the first layer;

FIG. 17 is a table illustrating a shape of the first layer of the member for the semiconductor manufacturing device according to the embodiment;

FIG. 18 is a table illustrating a shape of the first layer of the member for the semiconductor manufacturing device according to the embodiment;

FIG. 19 is a table illustrating a shape of the first layer of the member for the semiconductor manufacturing device according to the embodiment.

DETAILED DESCRIPTION

Figure 1:
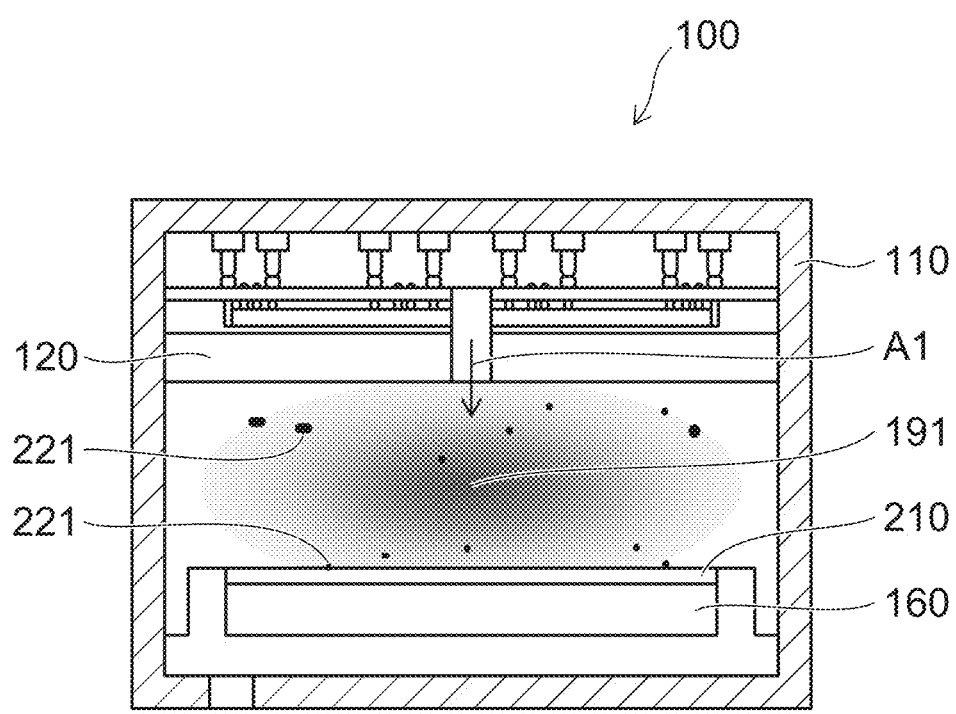
FIG. 1 is a cross-sectional view illustrating a semiconductor manufacturing device including a member for a semiconductor manufacturing device according to an embodiment.

Various embodiments of the invention will be described hereinafter with reference to the accompanying drawings. In the drawings, similar components are marked with like reference numerals, and a detailed description is omitted as appropriate.

FIG. 1 is a cross-sectional view illustrating a semiconductor manufacturing device including a member for a semiconductor manufacturing device according to an embodiment.

A semiconductor manufacturing device 100 shown in FIG. 1 includes a chamber 110, a member for the semiconductor manufacturing device 120, and an electrostatic chuck 160. The member for the semiconductor manufacturing device 120 is called as a top board or the like, for example, and is provided in an upper portion inside the chamber 110. The electrostatic chuck 160 is provided in a lower portion inside the chamber 110. That is, the member for the semiconductor manufacturing device 120 is provided on the electrostatic chuck 160 inside the chamber 110. An object to be adsorbed such as a wafer 210 or the like is placed on the electrostatic chuck 160.

A high frequency power is supplied to the semiconductor manufacturing device 100, and a source gas such as a halogen-based gas is introduced into the chamber 110 as indicated by an arrow A1 shown in FIG. 1, for example. Then, the source gas introduced into the chamber 110 is made into plasma in a region 191 between the electrostatic chuck 160 and the member for the semiconductor manufacturing device 120.

Here, if a particle 221 generated inside the chamber 110 adheres to the wafer 210, failure may occur in the manufactured device. In such a case, yield and productivity of the semiconductor device may decrease. For that reason, plasma resistance is required for the member for the semiconductor manufacturing device 120.

The member for the semiconductor manufacturing device may be a member disposed at a position other than the upper portion inside the chamber and around the chamber. The semiconductor manufacturing device based on the member for the semiconductor manufacturing device is not limited to the example of FIG. 1, and includes any semiconductor manufacturing device (semiconductor processing device) performing processing such as annealing, etching, sputtering, CVD or the like.

Figure 2A:
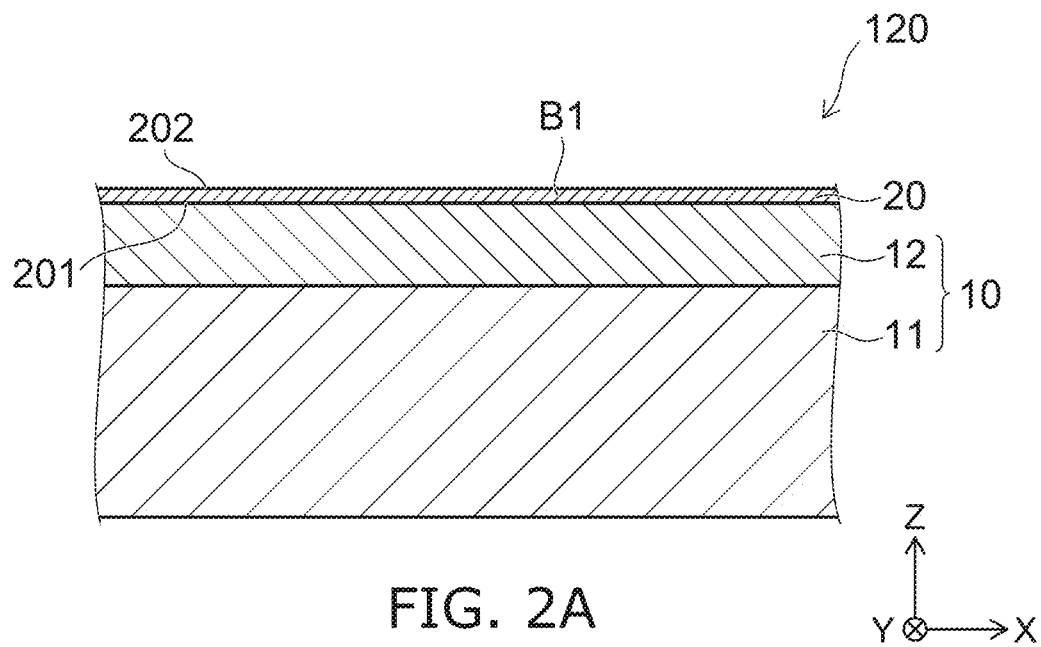
FIG. 2A and FIG. 2B are cross-sectional views illustrating the member for the semiconductor manufacturing device according to the embodiment.
Figure 2B:
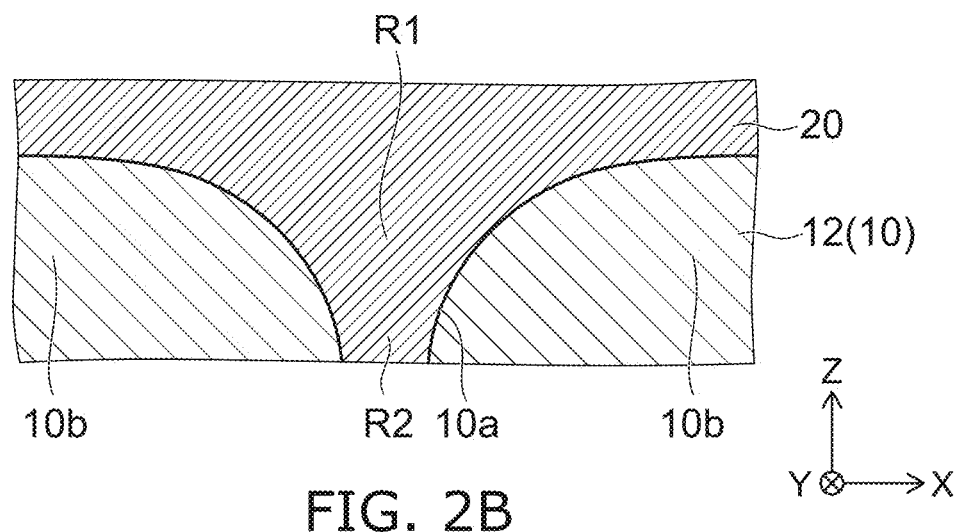

FIG. 2A and FIG. 2B are cross-sectional views illustrating the member for the semiconductor manufacturing device according to the embodiment.

As shown in FIG. 2A, the member for the semiconductor manufacturing device includes an alumite base material 10 and a first layer 20.

In the following description, a stacking direction of the alumite base material 10 and the first layer 20 is taken as a Z-axis direction. One direction perpendicular to the Z-axis direction is taken as an X-axis direction. A direction perpendicular to the Z-axis direction and the X-axis direction is taken as a Y-axis direction.

The alumite base material 10 includes a member 11, and an alumite layer 12 provided on the member 11. A material of the member 11 includes, for example, aluminum or an aluminum alloy. The alumite layer 12 includes aluminum oxide ($Al_2O_3$). The alumite layer 12 is formed by subjecting the member 11 to alumite treatment. That is, the alumite layer 12 is an anode oxide coating covering the surface of the member 11. A thickness of the alumite layer 12 is, for example, approximately not less than 0.5 micrometers (μm) and not more than 70 μm.

A process of the alumite treatment includes generally forming a dense aluminum oxide layer (coating) on a surface of an aluminum base material, growing the aluminum oxide layer, sealing treatment as necessary, and drying. Porous aluminum oxide is formed in the growing the aluminum oxide layer of these processes, and a hole is formed as one form of the concavity. A crack is formed as one form of the concavity in the aluminum oxide layer by a difference between a thermal expansion coefficient of aluminum metal and a thermal expansion coefficient of aluminum oxide, the difference is due to the heat treatment in the sealing treatment and the drying. If a thickness of the aluminum oxide layer formed by the alumite treatment is approximately 0.3 μm, the dense aluminum oxide layer without the concavity is obtained. If the thickness of the aluminum oxide layer is not less than 0.5 μm, the porous aluminum oxide with the concavity is formed. The thickness of a general alumite treatment coating is not less than 5 μm and not more than 70 μm.

The first layer 20 includes an yttrium compound. For example, the first layer 20 includes at least one of fluorine or oxygen and yttrium. The first layer 20 is, for example, yttrium oxide ($Y_2O_3$), yttrium fluoride ($YF_3$) or yttrium oxyfluoride (YOF). In the following example, the first layer 20 is a polycrystal of yttria ($Y_2O_3$). The thickness of the first layer 20 is, for example, approximately 5 μm.

The first layer 20 has a plane 201 on a side of the alumite base material 10 and a surface 202 on an opposite side to the plane 201. The first layer 20 contacts the alumite base material 10 on the plane 201. The surface 202 is a surface of the member for the semiconductor manufacturing device 120.

The first layer 20 is formed by "an aerosol deposition method". The aerosol deposition method is a method of spraying "aerosol" with fine particles including a brittle material dispersed in a gas from a nozzle toward the base material, colliding against the base material such as metal, glass, ceramics, plastics or the like, causing the brittle material particles to deform or crush by impact of the collision and causing those to join, and forming directly a layered structure (also called a film-shaped structure) made of constituent material of the particles on the base material.

In this example, the aerosol including particles including yttria is sprayed toward the base material (the alumite layer 12 of the alumite base material 10), and the layered structure (the first layer 20) is formed.

According to the aerosol deposition method, it is possible to form the layered structure at a normal temperature without particular necessity of heating means or cooling means, and the layered structure having a mechanical strength equivalent to or greater than a fired body can be obtained. It is possible to variously change the density, the mechanical strength, the electrical characteristics or the like of the layered structure by controlling a condition of fine particle collision, a shape and a composition or the like of the fine particles.

In the specification of the application, "polycrystal" refers to a structure formed by joining/accumulating of crystal particles. The crystal particle constitutes a crystal substantially by one. A diameter of the crystal particle is ordinarily not less than 5 nanometers (nm). However, in the case where the fine particles are captured into the structure without being crushed, the crystal particle is a polycrystal.

In the specification of the application, "fine particle" refers to a particle of which an average particle diameter identified by particle size distribution measurement or scanning electron microscope or the like is not more than 5 micrometers (μm), in the case where a primary particle is a dense particle. In the case where the primary particle is a porous particle which is easily crushed by the impact, a particle having an average particle diameter not more than 50 μm is referred to.

In the specification, "aerosol" indicates a solid-gas mixed phase body having the fine particles previously described dispersed in a gas such as helium, nitrogen, argon, oxygen, dry air, a mixed gas including those gases. Although "aggregate" is partially included, a state in which the fine particles are dispersed substantially alone is referred to. Although a gas pressure and a temperature of the aerosol are arbitrary, it is favorable for forming the layered structure that a concentration of the fine particles in the gas is in a range of 0.0003 mL/L to 5 mL/L at a time of being sprayed from a discharge port, in the case of converting the gas pressure to 1 atm and the temperature to 20 degrees of centigrade.

The process of the aerosol deposition method is ordinarily performed at a normal temperature, and one feature is that it is possible to form the layered structure at a temperature sufficiently lower than a melting point of the fine particles material, namely, at a few hundred degrees of centigrade or lower.

In the specification of the application, "the normal temperature" refers to an extremely lower temperature to a sintering temperature of ceramics, a room temperature environment of substantially 0 to 100° C.

The fine particles constituting powder serving as the source material of the layered structure include the brittle material such as ceramics or semiconductor or the like as a main component, and can include the particles of the same material property alone or the particles mixing different diameter particles. Furthermore, it is possible to use by mixing different kinds of brittle material fine particles or combining them. It is possible to mix the fine particles such as metal material or organic material or the like with brittle material fine particles, and to coat on the surface of the brittle material fine particles. Even in those cases, the layered structure is formed mainly of the brittle material.

In the specification of the application, "the powder" refers to a state of the fine particles previously described being naturally aggregated.

In a composite structure formed by this method based on the crystalline brittle fine particles as the source material, a portion of the layered structure of the composite structure is a polycrystal which the crystal particle size is smaller than the crystal particle size of the source fine particles, and the crystal is not crystal oriented in many cases. A grain boundary layer made of a glass layer does not substantially exist in the interface of the brittle material crystals. In many cases, a layered structure portion of the composite structure forms "an anchor layer" to dig into the surface of the base material (in this example, the alumite base material 10). The layered structure in which this anchor layer is formed is formed to adhere to the base material with extremely high strength.

The layered structure formed by the aerosol deposition method is clearly different from so called "a compacted powder body" in a state which the fine particles are packed by a pressure and the shape is held by physical adhesion, and has a sufficient strength.

Flying brittle material particles crush and deform on the base material in the aerosol deposition method. This can be confirmed by measuring the brittle material particles used as the source material and crystallite (crystal particle) size of the formed brittle material structure using X-ray diffraction method or the like. That is, the crystallite size of the layered structure formed by the aerosol deposition method is smaller than the crystallite size of the source fine particles. "A newly formed surface" in a state in which atoms originally existing inside the fine particles and bonded to another atom are bare is formed on "a misaligned surface" and "a fracture surface" formed by the crush or the deformation of the fine particles. It is considered that the layered structure is formed by joining the newly formed surface which has high surface energy and is active with the surface of the adjacent brittle material fine particles and the newly formed surface of the adjacent brittle material or the surface of the base material.

In the case where a hydroxyl group exists moderately on the surface of the fine particles in the aerosol, it can be considered that a mechano chemical acid base dehydration reaction occurs due to a local shear stress or the like generated between the fine particles and between the fine particles and the stricture at the collision of the fine particles, and the fine particles join together. It is considered that addition of continuous mechanical impact force from the external generates continuously these phenomena, joining is progressed and densified by repeat of the deformation and the crush of the fine particles, and the layered structure made of the brittle material is grown.

The first layer 20 including an yttrium compound (for example, yttria polycrystal) formed by the aerosol deposition method has a dense structure in comparison with the yttria fired body and the yttria sprayed film or the like. Thereby, the plasma resistance of the member for the semiconductor manufacturing device 120 according to the embodiment is higher than the plasma resistance of the fired body and the sprayed film. A probability that the member for the semiconductor manufacturing device 120 according to the embodiment will be a generation source of particles is lower than a probability that the fired body and the sprayed film will be a generation source of particles.

FIG. 2B is a cross sectional view enlarging the vicinity of a boundary B1 between the alumite layer 12 and the first layer 20 shown in FIG. 2A.

As shown in FIG. 2B, the alumite base material 10 includes the concavity 10a and the convexity 10b. As described previously, the alumite layer 12 is, for example, an anode oxide coating formed by the alumite treatment. A crack (concavity or hole) is formed in the alumite layer 12 during the alumite treatment. For that reason, the concavity 10a is formed on the surface of the alumite base material 10. The convexity 10b corresponds to a region where the crack is not formed on the alumite layer 12 in the alumite treatment.

In the specification of the application, "the concavity" is "the crack" or "the depression" or the like existing in the alumite layer, and refers to those not formed intentionally before and after the alumite treatment. For example, "the concavity" in the specification of the application does not include those formed by intentional mechanical processing.

The first layer 20 has a first region R1 and a second region R2. The first region R1 is a region on a side of the surface 202 of the first layer 20. The second region R2 is a region on a side of the alumite base material 10 of the first layer 20. The second region R2 and at least a portion of the first region R1 are arranged in the Z-axis direction. The second region R2 is located between the first region R1 and the alumite base material 10.

The second region R2 is provided inside the concavity 10a. That is, the second region R2 is surrounded by the surface of the alumite base material 10 forming the concavity 10a in the X-Y plane. For example, the second region R2 contacts the surface of the alumite base material 10 forming the concavity 10a. The first region R1 is provided above the second region R2 (surface 202 side) and above the convexity 10b. For example, the first region R1 contacts the alumite base material 10 in a shallow portion of the convexity 10b and the concavity 10a. The surface 202 of the first layer 20 is formed by the first region R1.

In the member for the semiconductor manufacturing device according to the embodiment, the first region R1 is denser than the second region R2. In other words, the second region R2 is sparser than the first region R1. According to this, the peeling off of the first layer 20 and the alumite base material 10 can be suppressed while improving the plasma resistance of the first layer 20.

In the following the structure of the first layer 20 formed on the surface of the alumite base material 10 (the alumite layer 12) will be described.

Figure 3:
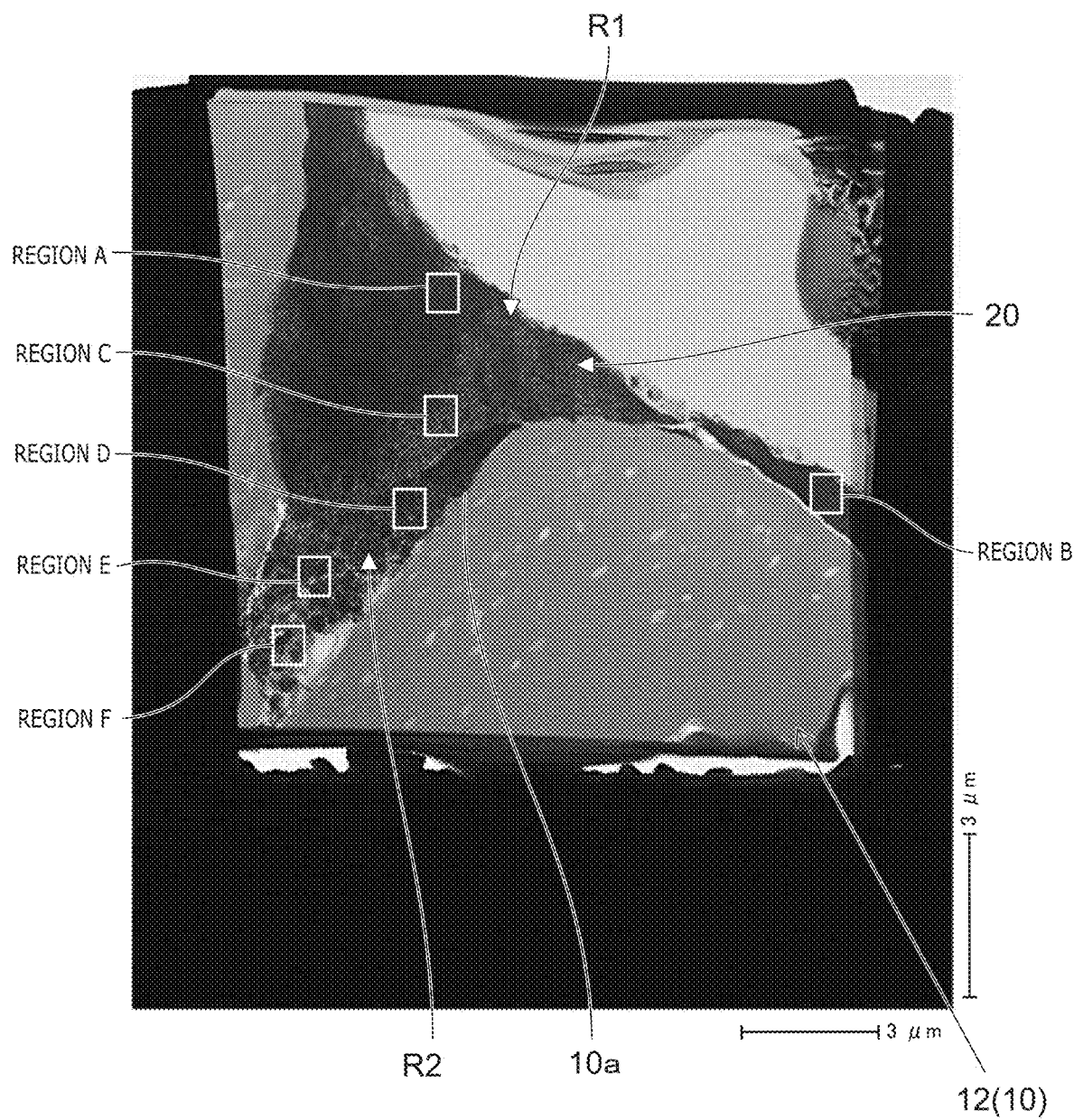
FIG. 3 is a photograph showing a cross section of the member for the semiconductor manufacturing device according to the embodiment.

FIG. 3 is a photograph showing a cross section of the member for the semiconductor manufacturing device according to the embodiment.

FIG. 3 shows a TEM image (Transmission Electron Microscope), and corresponds to the cross section shown in FIG. 2B.

In the following, the structures of regions A to F in the first layer 20 shown in this photograph will be described. The regions A and B are included in the first region R1 previously described. The regions D, E and F are included in the second region R2 previously described.

A white region above the first region R1 is a resin member used for fabricating an observation sample.

Figure 4:
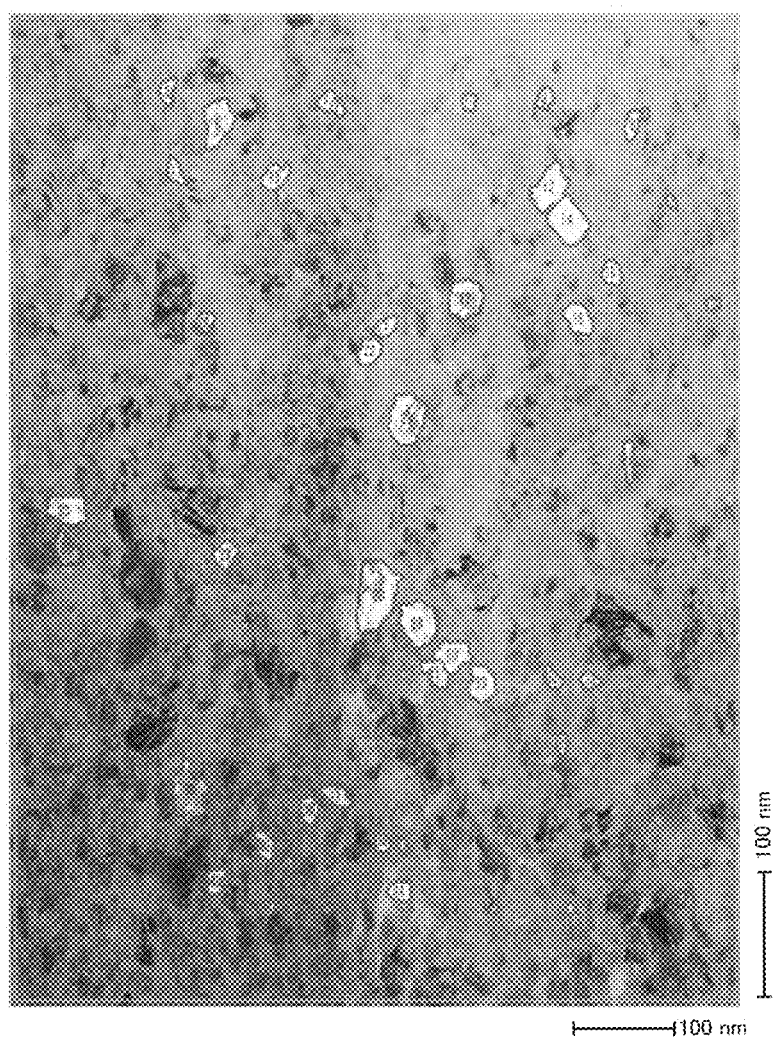
FIG. 4 is a photograph showing a cross section of a first layer.
Figure 5:
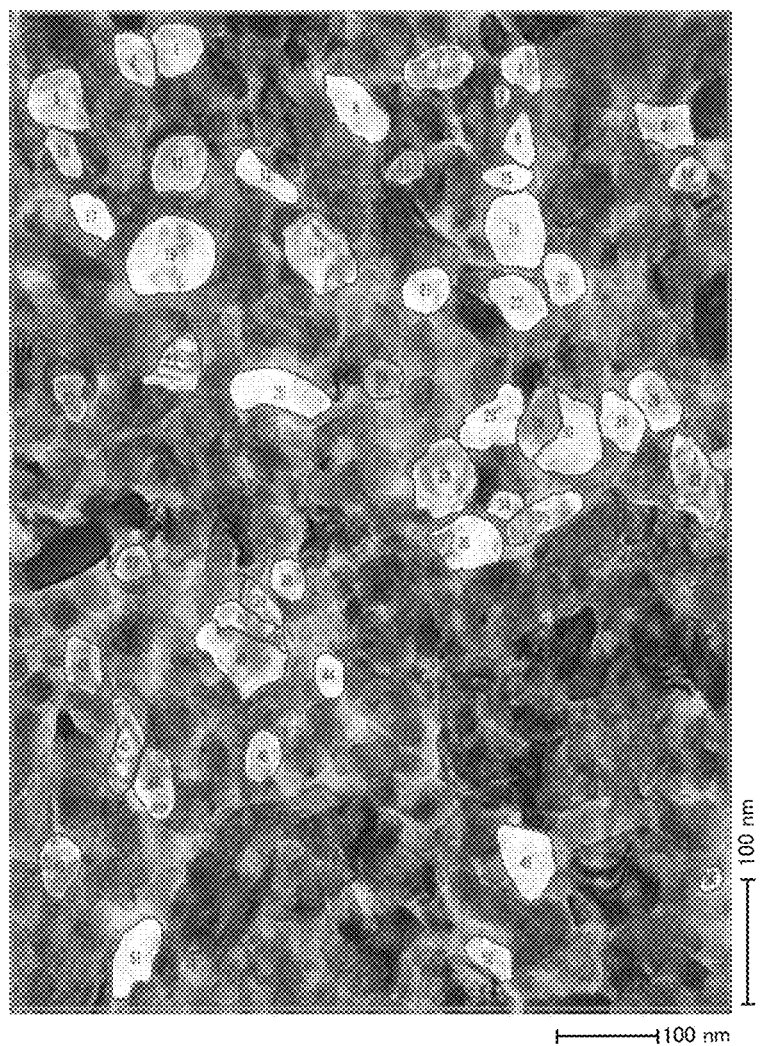
FIG. 5 is a photograph showing a cross section of the first layer.

FIG. 4 and FIG. 5 are photographs showing a cross section of the first layer. These photographs are imaged by TEM. Observation magnification is 250,000 times, and an acceleration voltage is 300 kV.

FIG. 4 is a photograph enlarging a portion of a region A of the first region R1, and FIG. 5 is a photograph enlarging a portion of a region E of the second region R2. The magnification of the photograph shown in FIG. 4 is the same as the magnification of the photograph shown in FIG. 5. As seen from FIG. 4 and FIG. 5, a crystal particle in the region A tends to be smaller than a crystal particle in the region E.

Figures 6A, 6B:
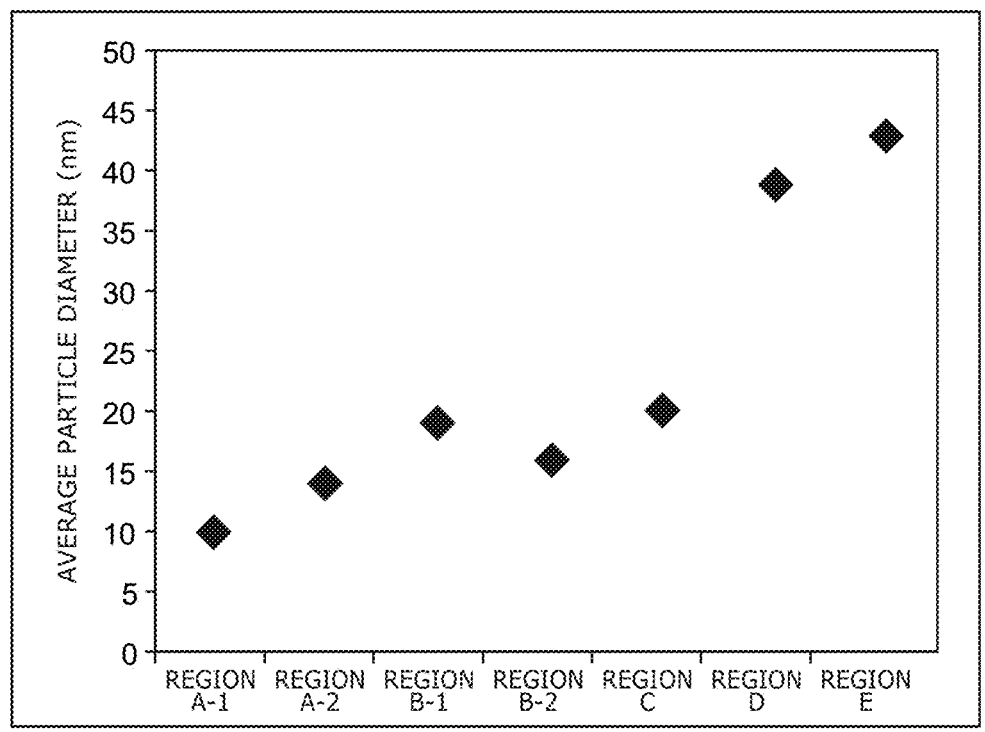
FIG. 6A and FIG. 6B are a table and a graph showing a particle diameter in the first layer.

FIG. 6A and FIG. 6B are a table and a graph showing a particle diameter in the first layer.

FIG. 6A shows an average value (an average particle diameter), the maximum value and the minimum value of the particle diameter in each of the regions A to E. FIG. 6B shows the average particle diameter shown in FIG. 6A in a graph. The region A-1 shows a portion of the region A, and the region A-2 shows another portion of the region A. The region B-1 shows a portion of the region B, and the region B-2 shows another portion of the region B.

The particle diameters shown in FIG. 6A and FIG. 6B are calculated as follows. 2 places (2 views) are imaged and 2 photographs similar to FIG. 4 and FIG. 5 are acquired at a time. The imaged photographs are loaded by image processing software (Adobe System Co., Photoshop (registered trade mark)). The crystal particle having a grain boundary clearly observed is selected, and a line is drawn on an interface of the crystal particle selected by Photoshop (registered trade mark). In FIG. 4 and FIG. 5, the selected crystal particles are marked with numbers. The number of crystal particles selected here (number N shown in FIG. 6A) is approximately 100 in total as acquired from two photographs in each of the regions A-1, A-2, B-1, B-2, C to E.

Next, image analysis software (Nireco Co., LUZEX AP) is used, and an equivalent circle diameter (diameter) is calculated on the basis of the line drawn on the interface with respect to each of the selected crystal particles. The average particle diameter shown in FIG. 6A is an arithmetic average value (nm) in each region of the equivalent circle diameter calculated as described above. The maximum value and the minimum value shown in FIG. 6A are the maximum value (nm) and the minimum value (nm) in each region of the equivalent circle diameter calculated as described above.

As shown in FIG. 6A and FIG. 6B, the average particle diameter in the regions A, B are shorter than the average particle diameter in the regions D, E. That is, the average particle diameter in the first region R1 is shorter than the average particle diameter in the second region R2. The average particle diameter of the first region R1 is, for example, not less than 10 nm and not more than 19 nm, favorably not less than 14 nm and not more than 16 nm. The average particle diameter of the second region R2 is, for example, not less than 20 nm and not more than 43 nm, favorably not less than 39 nm and not more than 43 nm. This means that when the first layer 20 is formed by the aerosol deposition method, the crystal particle in the first region R1 collapses more than the crystal particle in the second region R2. That is, the first layer 20 has a dense structure in the surface side of the member for the semiconductor manufacturing device 120. Thereby, the plasma resistance can be improved.

Since the film is formed by the collision of the particles in the aerosol deposition method and is packed by a high pressure, the stress (residual stress) is generated near the interface of the first layer 20 and the alumite layer 12. This stress is considered to be likely concentrated particularly near the crack (the concavity 10a) of the alumite layer 12. When the stress is generated in the crack of the alumite layer 12, the crack progresses, the first layer 20 peels off from the alumite base material 10, and there is a fear of particle generation.

On the contrary, in the embodiment, the second region R2 in the concavity 10a has a sparse structure in comparison with the first region R1 on the surface side. Since the second region R2 has the sparse structure, the stress generated near the interface of the first layer 20 in the concavity 10a and the alumite base material 10 can be released and relaxed. Thereby, the first layer 20 can be suppressed from peeling off from the alumite base material 10.

As described above, according to the embodiment, while improving the plasma resistance of the surface of the first layer 20 formed on the alumite base material 10, the first layer 20 can be suppressed from peeling off from the alumite base material 10 and the particles can be reduced.

FIG. 7a to FIG. 7C and FIG. 8A to FIG. 8D are photographs illustrating structure analysis of the crystal particles in the first layer. The first layer processed to have a thickness of approximately not less than 70 nm and not less than 100 nm is used in the structure analysis.

Figure 7A:
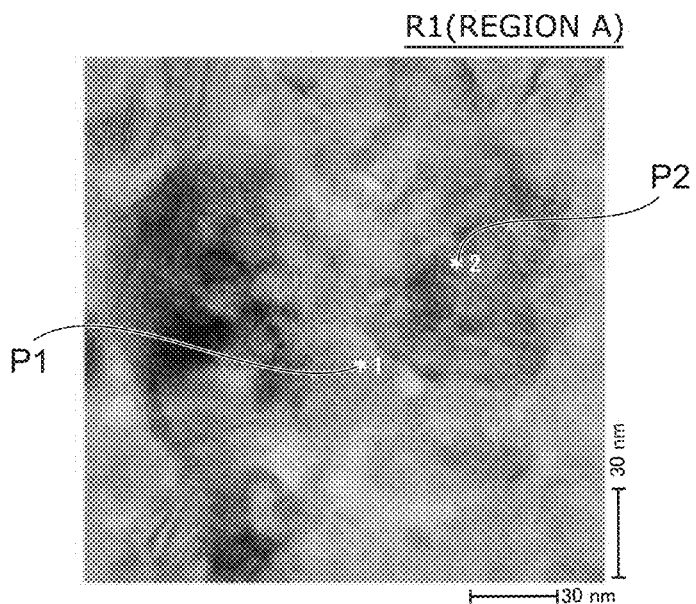
FIG. 7A to FIG. 7C are photographs illustrating structure analysis of crystal particles in the first layer.
Figure 7B:
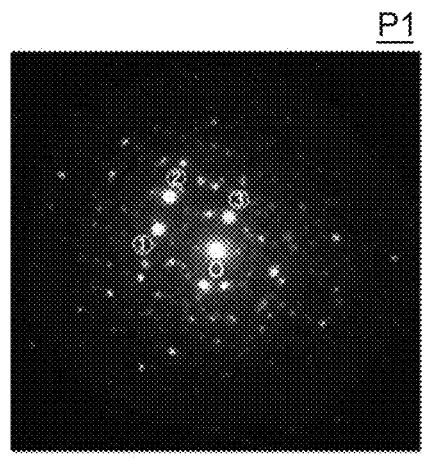
Figure 7C:
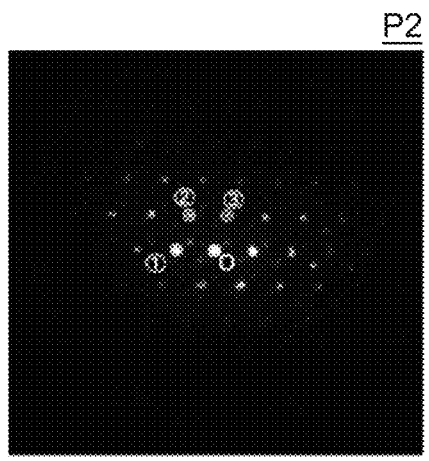

FIG. 7A to FIG. 7C are photographs showing the analysis in the region A of the first region R1. FIG. 7A is a TEM image showing an analyzed point. FIG. 7B shows a diffraction pattern of a polar electron beam diffraction at a point P1 shown in FIG. 7A. FIG. 7C shows a diffraction pattern of a polar electron beam diffraction at a point P2 shown in FIG. 7A.

A lattice spacing (d) of the crystal at the analyzed point and a face angle of a lattice plane can be obtained from the diffraction pattern. The obtained lattice spacing and the face angle are compared with the lattice spacing and the face angle of the known structure (JCPDS card). Thereby, the crystal structure of the crystal particle at each point is determined.

The crystal structure at the point P1 is a monoclinic crystal of yttria as shown in FIG. 7B. The crystal structure at the point P2 is also a monoclinic crystal of yttria as shown in FIG. 7C.

FIG. 8A to FIG. 8D are photographs showing the analysis in the region E of the second region R2. FIG. 8A and FIG. 8C are TEM images showing analyzed points. FIG. 8B shows a diffraction pattern of a polar electron beam diffraction at a point P3 shown in FIG. 8A. FIG. 8D shows a diffraction pattern of a polar electron beam diffraction at a point P4 shown in FIG. 8C.

The crystal structures at the points P3, P4 are determined as well as the descriptions about the points P1, P2. The crystal structure at the point P3 is a cubic crystal of yttria as shown in FIG. 8B. The crystal structure at the point P4 is a cubic crystal of yttria as shown in FIG. 8D.

FIG. 9 is a table showing the crystal structure of the crystal particle in the first layer.

Analyses similar to descriptions with respect to FIG. 7A to FIG. 7C and FIG. 8A to FIG. 8D are performed for each of the regions A to F. FIG. 9 shows the crystal structure of 2 points (2 views) among measurements of 20 points in the respective regions. Results such as "monoclinic predominant", "cubic predominant", "mixed crystal structure" are determined from the 20 points measurements.

The regions A and B are in "monoclinic predominant", and the regions D, E and F are in "cubic predominant". The region C is in the mixed crystal structure of monoclinic crystal and cubic crystal. That is, for example, the first region R1 has a monoclinic crystal as a main phase, and the second region R2 has a cubic crystal as a main phase. The state of the monoclinic crystal being a main phase means the state in which points of the monoclinic crystal are more than points of the crystal structure other than the monoclinic crystal when the crystal structure is analyzed at multiple points (for example, not less than 20 points). Similarly, the state of the cubic crystal being a main phase means the state in which points of the cubic crystal are more than points of the crystal structure other than the cubic crystal.

The monoclinic crystal is the crystal structure which is more distorted than the cubic crystal. That is, the crystal particle in the first region R1 and the crystal particle in the region of the mixed crystal structure are more distorted than the crystal particle in the second region R2. This means that when the first layer 20 is formed by the aerosol deposition method, the crystal particle in the first region R1 is more collapsed than the crystal particle in the second region r2 and the crystal particles in the region of the mixed crystal structure. For this reason, the first layer 20 has a dense structure on the surface side of the member for the semiconductor manufacturing device 120. Thereby, the plasma resistance can be improved. The first layer 20 has a sparser structure in the second region R2 than the first region R1. Since the second region R2 has a sparse structure, the stress generated near the interface of the first layer 20 in the concavity 10a and the alumite base material 10 can be relaxed and the peeling off can be prevented.

FIG. 10 is a table showing the crystallite size in the first layer.

The crystallite size is calculated about five samples (samples 1 to 5) of the first layer 20 according to the embodiment. The crystallite size (nm) of the cubic phase and the crystallite size (nm) of the monoclinic phase in the respective samples are calculated.

The following procedure 1 to the procedure 5 will be performed in calculating the crystallite size.

(Procedure 1): The X-ray diffraction spectrum of the yttrium compound (the first layer 20) formed on the alumite base material is acquired.

(Procedure 2): The X-ray spectrum is loaded by X-ray diffraction software (PANalytical Co., High Score).

(Procedure 3): K-α2 line is removed.

(Procedure 4): Smoothing is performed.

(Procedure 5): The crystallite size is analyzed by using the following Scherrer formula.

$$D=K\lambda/(\beta \cos \theta)$$

Here, D is a crystallite size, β is a peak half width (radian (rad)), θ is a Bragg angle (rad), and λ is a wavelength of the X-ray used for the measurement.

β is calculated by β=(βobs−βstd) in the Scherrer formula. βobs is a half width of the X-ray diffraction peak of the measurement sample, βstd is a half width of the X-ray diffraction peak of the standard sample. 0.94 is used for a value of K. The peak from (222) plane is used for the crystallite size of the cubic phase. The peak from (402) plane is used for the crystallite size of the monoclinic phase. A pseud-Voigt function is adopted for separation of the peak.

As shown in FIG. 10, the crystallite size (the average particle diameter) of the monoclinic phase obtained from the X-ray diffraction is small in comparison with the crystallite size (the average particle diameter) of the cubic phase obtained from the X-ray diffraction. In the embodiment, the crystallite size of the cubic phase is not less than 8 nanometers and not more than 39 nanometers, more favorably not less than 10 nm and not more than 21 nm, and the crystallite size of the monoclinic phase is not less than 5 nanometers and not more than 19 nanometers, more favorably not less than 5 nm and not more than 12 nm. This means that yttrium oxide which is originally in the cubic phase collapses and changes to the monoclinic phase in forming the first layer 20 by the aerosol deposition method. That is, the first layer 20 has a dense structure on the surface side of the member for the semiconductor manufacturing device 120. Thereby, the plasma resistance can be improved.

Figures 11A, 11B:
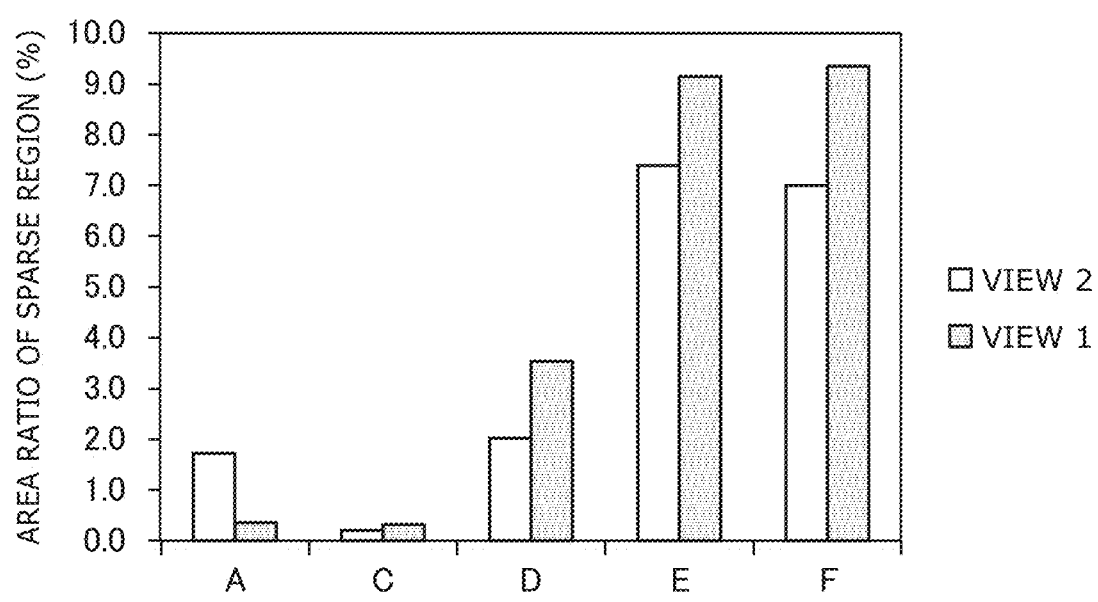
FIG. 11A and FIG. 11B are a table and a graph showing an area ratio of a sparse region in the first layer.

FIG. 11A and FIG. 11B are a table and a graph showing an area ratio of the sparse region in the first layer.

FIG. 11A is a table showing an area ratio (%) of the sparse region in each of the regions A, C to F. FIG. 11B shows the area ratio (%) of the sparse region shown in FIG. 11A in a graph.

Here, "area ratio (%) of sparse region" is a ratio of an area of the sparse region in a certain cross section to an area of the relevant cross section. The calculation of the specific "area ratio (%) of sparse region" will be described with reference to FIG. 12A to FIG. 13D.

FIG. 12A to FIG. 13D are photographs showing the cross section of the first layer.

The following procedure 1 to the procedure 6 will be performed in calculating the area ratio (%) of the sparse region.

(Procedure 1): A TEM image of the cross section of the first layer 20 is loaded by image analysis software (Mitani Co., WINROOF). The observation magnification of the TEM image is 250,000 times. The loaded TEM image is based on a bright-field image.

(Procedure 2): The loaded image (TEM image) is converted to monochrome (gray scale) and corrected horizontally.

Figure 12A:
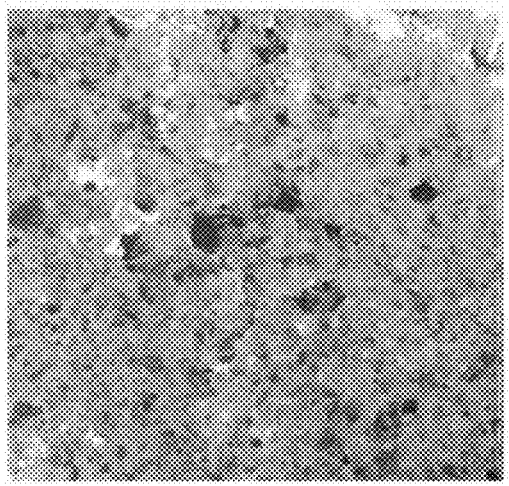
FIG. 12A to FIG. 12D are photographs showing a cross section of the first layer.
Figure 12B:
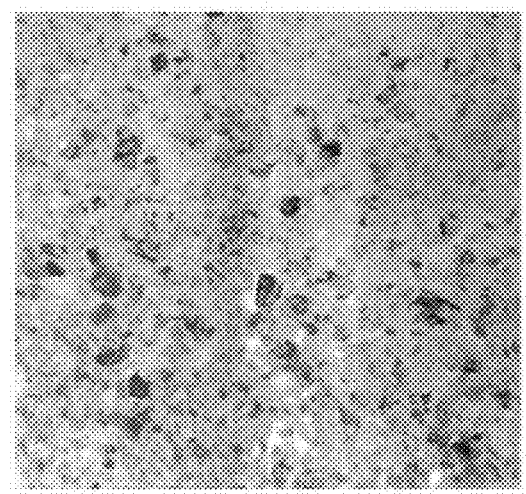
Figure 13A:
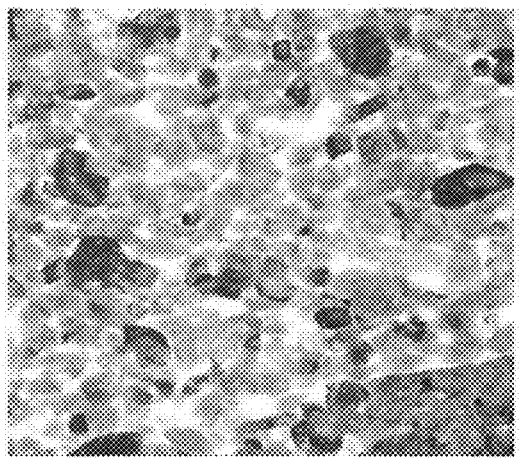
FIG. 13A to FIG. 13D are photographs showing a cross section of the first layer.
Figure 13C:
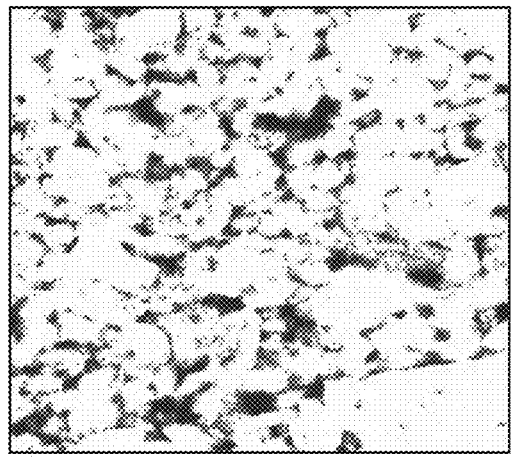
Figure 13B:
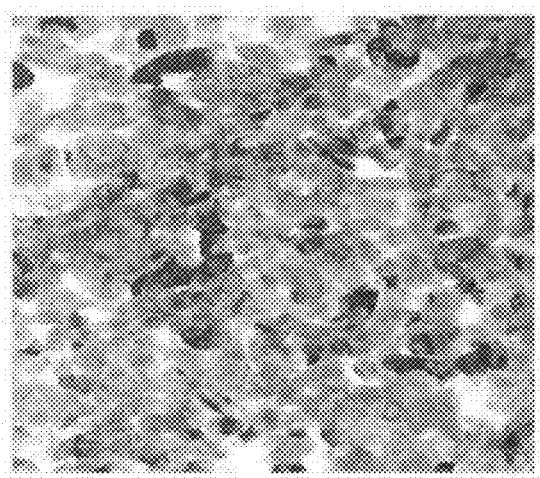

(Procedure 3): The region for image analysis is defined by ROI setting, and a portion unnecessary for the analysis is removed from the loaded TEM image. In this way, the observation range used for calculating the area ratio (%) of the sparse region can be selected. A size of one observation range is not less than 500 nm square. For example, FIG. 12A is a photograph for an observation range in the cross section of the region A (view 1), and FIG. 12B is a photograph for another observation range of the cross section in the range A (view 2). FIG. 13A is a photograph for an observation range of the cross section of the range E (view 1), and FIG. 13B is a photograph for another observation range of the cross section in the region E (view 2).

(Procedure 4): Color of the image is expressed in 256 gradations. Then, a value for dark is taken as 0, a value for white is taken as 255. The more white the color is, the structure is sparse, and the darker the color, the structure is dense. A region having a gradation value of 190 or more in the image (regions where the color is white or near white) is selected and colored.

Figure 12C:
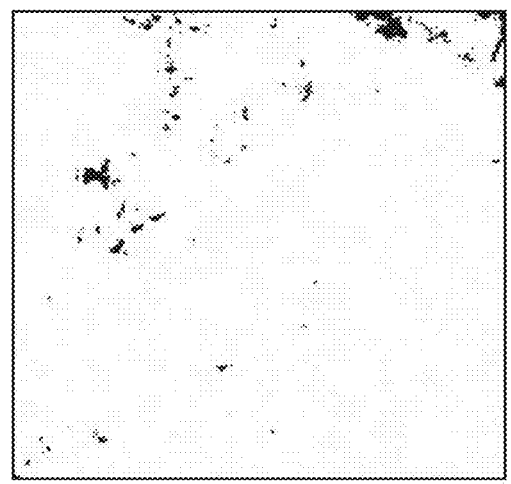
Figure 12D:
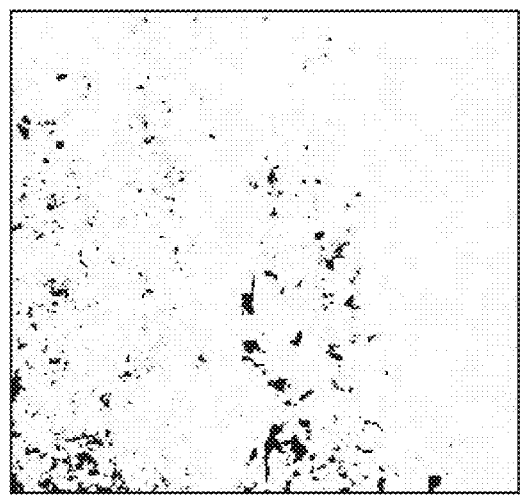
Figure 13D:
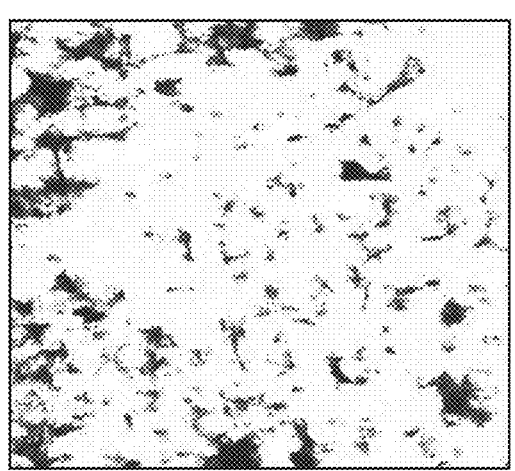

FIG. 12C is a drawing which the color of the photograph of FIG. 12A is changed in order to emphasize the colored region in the photograph of FIG. 12A. The region shown by dark black in FIG. 12C correspond to the colored region by the procedure 4. Similarly, FIG. 12D shows the region colored by the procedure 4 in the photograph of FIG. 12B, FIG. 13C shows the region colored by the procedure 4 in the photograph of FIG. 13A, and FIG. 13D shows the region colored by the procedure 4 in the photograph of FIG. 13B.

(Procedure 5): A fill-in process is performed for the colored region, and holes in the colored region (uncolored places) are colored.

(Procedure 6): The ratio of the area of the colored region in one observation range to the area of the relevant observation range is calculated on the software, and is taken as the area ratio of the sparse region. That is, the area ratio of sparse region (%)=(area of the colored region in the observation range)/(area of the observation range)×100.

From the above procedures 1 to 6, the area ratio of the sparse region in the observation range (view 1) shown in FIG. 12A is calculated to be 0.4%. The area ratio of the sparse region in the observation range (view 2) shown in FIG. 12B is 1.7%. In this way, it is found that the area ratio of the sparse region is low in the first region R1 (the region A), and the first region R1 has the dense structure.

Similarly, the area ratio (%) of the sparse region is calculated for 2 views of each of the regions C to F, and the results are shown in FIG. 11A and FIG. 11B. The area ratio of the sparse region of the first region R1 (the region A) is, for example, not less than 0.4% and not more than 1.7%. The area ratio of the sparse region of the second region R2 (the regions D to F) is, for example, not less than 2.0% and not more than 9.3%.

It is found from the above that the first layer 20 has the dense structure in the first region R1 of the surface of the member for the semiconductor manufacturing device 120, and has the sparse structure in the second region R2 of on a side of the alumite base material 10.

Figure 14:
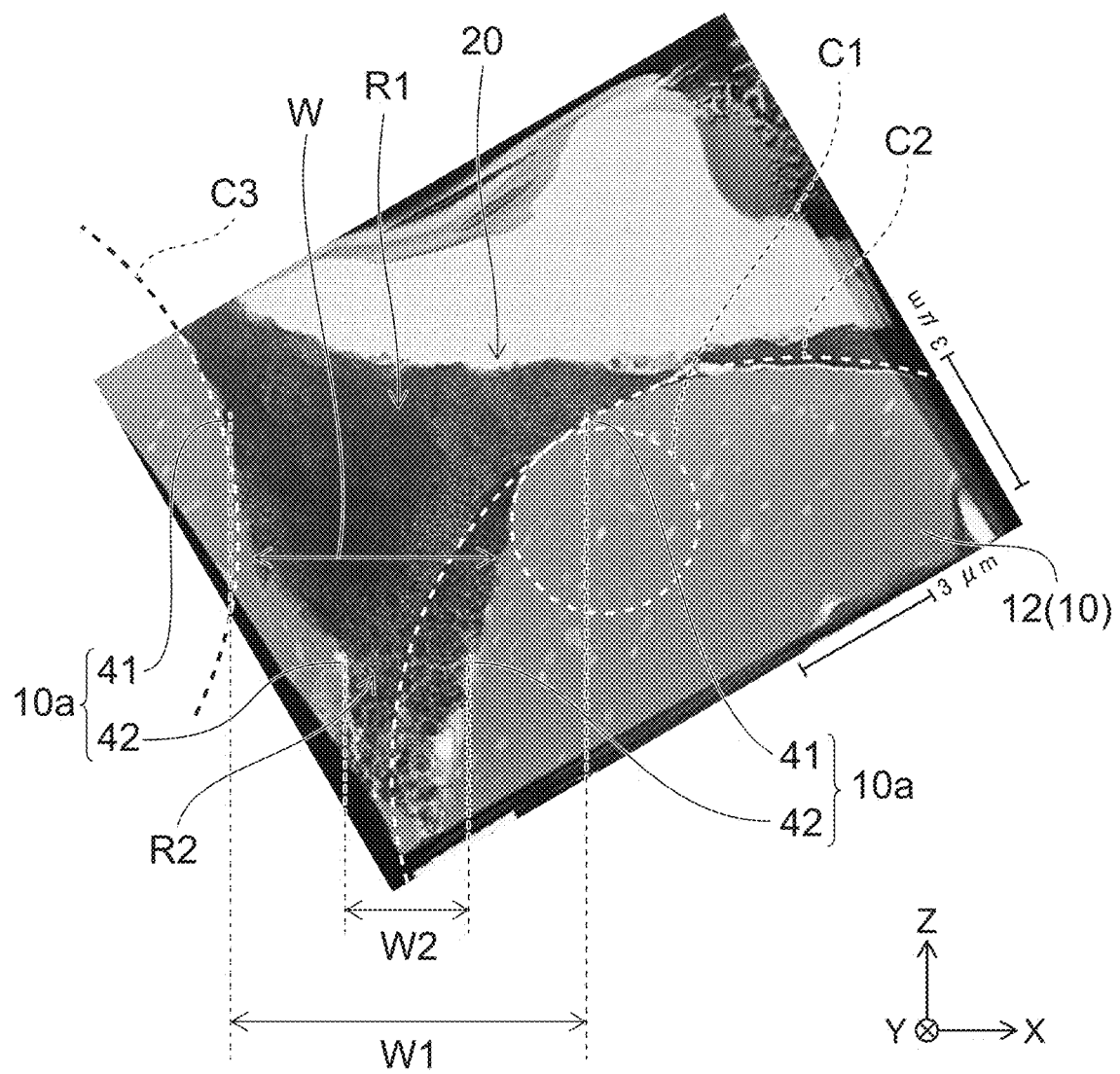
FIG. 14 is a photograph showing a cross section of the member for the semiconductor manufacturing device according to the embodiment.

FIG. 14 is a photograph showing the cross section of the member for the semiconductor manufacturing device according to the embodiment.

FIG. 14 shows the cross section along the Z-axis direction of the first layer 20 and the alumite layer 12 as well as FIG. 3. The concavity 10*a* has a first portion 41 provided with the first region R1 and a second portion 42 provided with the second region R2.

The first portion 41 and the second portion 42 are arranged in the Z-axis direction. The first portion is a portion of the concavity 10*a* located above, namely, a portion having a shallow hole. For example, the surface of the alumite base material 10 forming the first portion 41 surrounds a portion of the first region R1 in the X-Y plane. In other words, the portion of the first region R1 is located inside the first portion 41. For example, the first portion 41 is a surface contacting the first region R1 of the concavity 10*a*.

The second portion 42 is a portion located below the first portion 41, namely, a portion having a deep hole. For example, the surface of the alumite base material 10 forming the second portion 42 surrounds the second region R2 in the X-Y plane. In other words, the second region R2 is located in the second portion 42. For example, the second portion 42 is a surface contacting the second region R2 of the concavity 10a.

A width W of the concavity 10a in the cross section shown in FIG. 14 becomes narrower, as it goes away from the surface of the member for the semiconductor manufacturing device 120. For example, a width W2 of the second portion 42 is narrower than a width W1 of the first portion 41. The width W1 of the first portion 41 is, for example, equivalent to a distance between surfaces of the alumite layers 12 arranged in the X-axis direction via the first region R1. The width W2 of the second portion 42 is, for example, equivalent to a distance between surfaces of the alumite layers 12 in the X-axis direction via the second region R2.

If the width of the concavity 10a changes rapidly at a certain portion, the stress concentrates in the portion. On the contrary, in the member for semiconductor manufacturing device 120 according to the embodiment, the width W of the concavity 10a becomes narrow gradually in a direction from the first layer 20 toward the alumite base material 10. Thereby, the width W of the concavity 10a can be suppressed from changing rapidly, and the stress generated near the interface of the first layer 20 in the concavity 10a and the alumite base material 10 can be suppressed from being concentrated. Therefore, the first layer 20 can be suppressed from peeling off from the alumite base material 10, and the particles can be reduced.

Figure 15:
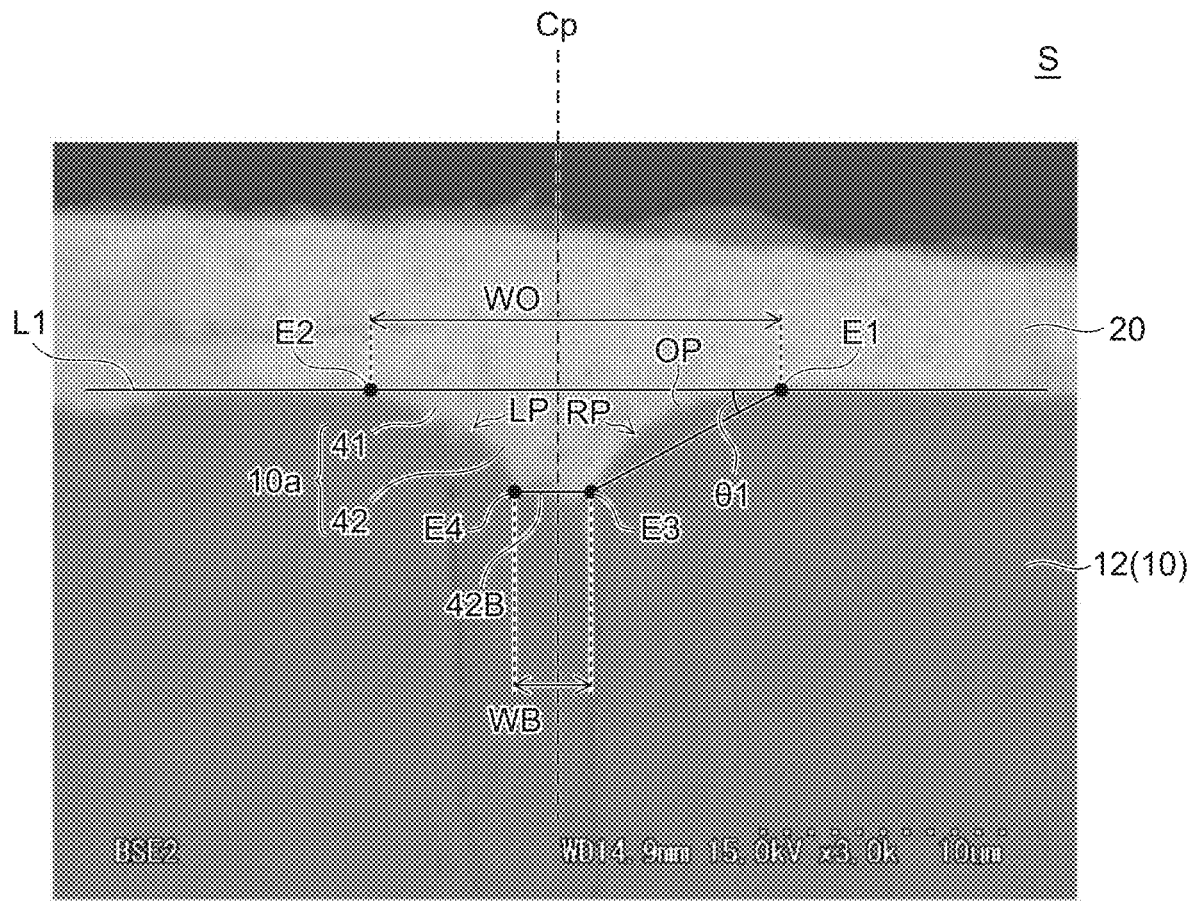
FIG. 15 is a photograph showing a cross section of the member for the semiconductor manufacturing device according to the embodiment.
Figure 16:
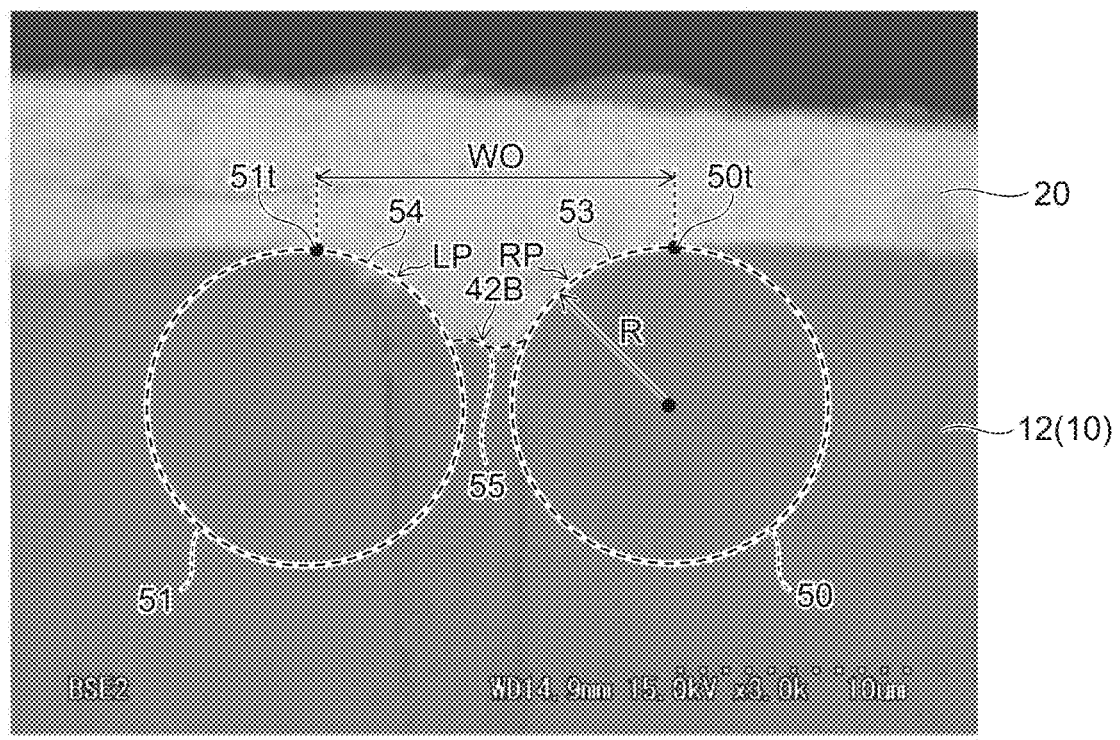
FIG. 16 is a photograph showing a cross section of the member for the semiconductor manufacturing device according to the embodiment.

FIG. 15 and FIG. 16 are photographs showing the cross section of the member for the semiconductor manufacturing device 120 according to the embodiment.

FIG. 15 and FIG. 16 show a cross section S along the Z-axis direction of first layer 20 and the alumite layer 12.

An opening OP of the concavity 10a (the first portion 41) has a first end portion E1 and a second end portion E2 which are separate each other in the cross section along the Z-axis direction. The first end portion E1 and the second end portion E2 are end portions in the X-axis direction of the concavity 10a, and upper end portions of the opening OP of the concavity 10a.

Each of the first end portion E1 and the second end portion E2 is a contact point of a first straight line L1 and the alumite layer 12. The first straight line L1 is a tangential line contacting the alumite layer 12 across the concavity 10a in a boundary of the first layer 20 and the alumite layer 12.

The concavity 10a includes a right side portion PR and a left side portion LP arranged each other in the X-axis direction in the cross section along the Z-axis direction. The right side portion RP is located one side as seen from a center position Cp shown in FIG. 15, and the left side portion LP is located on other side as seen from the center position Cp. The center position Cp is between a position in the X-axis direction of the first end portion E1 and a position in the X-axis direction of the second end portion E2. The first end portion E1 is, for example, a point of the right side portion RP near the surface 202 of the outer most first layer 20. The second end portion E2 is, for example, a point of the left side portion LP near the surface 202 of the outer most first layer 20.

As shown in FIG. 15, a distance between the first end portion E1 and the second end portion E2 is taken as an opening width WO of the first portion 41.

Alternatively, as shown in FIG. 16, a top 50t of a circle 50 may be taken as the first end portion E1 and a top 51t of a circle 51 may be taken as the second end portion E2. The circle 50 is an inscribed circle contacting a boundary 53 of the first layer 30 in the concavity 10a and the right side portion RP. The circle 51 is an inscribed circle contacting a boundary 54 of the first layer 20 in the concavity 10a and the left side portion LP. The top 50t is a point of the circle 50 nearest to the surface 202 of the first layer 20, and the top 51t is a point of the circle 51 nearest to the surface 202 of the first layer 20. In this example, the second portion 42 has a bottom surface 42B extending along the X-Y plane. In such a case, the boundary 53 and the boundary 54 do not include a boundary 55 of the first layer 20 and the bottom surface 42B. The boundary 53 and the boundary 54 are curved upward convex (a direction toward the surface of the first layer 20).

As shown in FIG. 15, the bottom surface 43B has a third end portion E3 and a fourth end portion E4 in the cross section along the Z-axis direction. The third end portion E3 is located on the same side as the first end portion E1 as seen from the center position Cp. That is, the third end portion E3 is a point on the right side portion RP. The fourth portion E4 is located on the same side as the second end portion E2 as seen from the center position Cp. That is, the fourth end portion E4 is a point on the left side portion LP. A distance between the first end portion E1 and the third end portion E3 is shorter than a distance between the first end portion E1 and the fourth end portion E4.

For example, the third end portion E3 or the fourth end portion E4 is a point of the second portion 42 furthest from the surface 202 of the first layer 20. A distance between the third end portion E3 and the fourth end portion E4 is taken as a width WB of the bottom surface 42B in the cross section along the Z-axis direction.

As shown in FIG. 15, an angle made by the straight line (the straight line L1) connecting the first end portion E1 and the second end portion E2 and a straight line L2 connecting the first end portion E1 and the bottom surface 42B in the shortest length is taken as an angle $\theta1(°)$. The straight line L2 is a straight line connecting the first end portion E1 and the third end portion E3.

In FIGS. 15, 16, for example, in the case where the concavity 10a is a crack, the cross section perpendicular to an extending direction of the crack in the X-Y plane is observed. In other words, the extending direction of the crack corresponds to, for example, the Y-axis direction.

FIG. 17 is a table illustrating a shape of the first layer of the member for the semiconductor manufacturing device according to the embodiment.

For 25 samples of the first layer 20 according to the embodiment, a ratio of the opening width WO of the first portion 41 to the width WB of the bottom surface 42B (WO/WB) is calculated.

As shown in FIG. 17, the ratio (WO/WB) is not less than 1.1 and not more than 9.7. That is, in the embodiment, the opening width WO is not less than 1.1 times and not more than 9.7 times of the width WB. For example, in the cross section shown in FIG. 15, the opening width WO of the first portion 41 is 14.5 µm and the width WB of the bottom surface 42B is 3.5 µm, and the opening width WO is 4 times of the width WB.

When the ratio (WO/WB) is 1, the width of the first portion 41 and the width of the second portion 42 are the same. In this case, the stress concentrates on the first portion 41, and there is a fear that the first layer 20 peels off from the alumite base material 10. On the contrary, in the embodiment, the ratio (WO/WB) is not less than 1.1 times. Thereby, concentration of the stress generated near the interface of the first layer 20 in the concavity 10a and the alumite base material 10 can be suppressed. Therefore, the first layer 20 can be suppressed from peeling off from the alumite base material 10, and the particles can be reduced.

FIG. 18 is a table illustrating a shape of the first layer of the member for the semiconductor manufacturing device according to the embodiment.

For 25 samples of the first layer 20 according to the embodiment, the angle θ1 is calculated.

As shown in FIG. 18, in the embodiment, the angle θ1 is not less than 10° and not more than 89°, more favorably not less than 17° and not more than 73°. This shows that the width of the concavity 10a becomes narrow gradually from the first region R1 toward the second region R2. Thereby, the width of the concavity 10a can be suppressed from changing rapidly, and concentration of the stress generated near the interface of the first layer 20 in the concavity 10a and the alumite base material 10 can be suppressed. Therefore, the first layer 20 can be suppressed from peeling off from the alumite base material 10, and the particles can be reduced.

In the cross section shown in FIG. 14, the boundary of the first layer 20 in the concavity 10a and the alumite base material 10 is curved, and has a curvature. For example, virtual circles C1, C2, C3 approximate a portion of the boundary of the first layer 20 in the concavity 10a and the alumite base material 10, respectively. A radius of the virtual circle C1 is 3.7 µm, a radius of the virtual circle C2 is 16.4 µm, and a radius of the virtual circle C3 is 16 µm. The respective virtual circles shown in FIG. 14 are one example. In the cross section observation shown in FIG. 16, a curvature radius R of the boundary (the boundary 53 or the boundary 54) of the first layer 20 in the concavity 10a and the alumite base material 10 is obtained. The curvature radius R is a radius of the circle 50 or the circle 51. In the case where a portion of the boundary 53 or the boundary 54 has a concavity and convexity, that is, the boundary has not a curved shape, the curvature radius R is obtained from the virtual circles approximating a portion having a curved shape.

FIG. 19 is a table illustrating a shape of the first layer of the member for the semiconductor manufacturing device according to the embodiment.

For 25 samples of the first layer 20 according to the embodiment, the curvature radius R is calculated.

As shown in FIG. 19, in the embodiment, the curvature radius R is not less than 0.4 µm and less than 50 µm.

If the boundary of the first layer 20 in the concavity 10a and the alumite base material 10 has a discontinuous change, the stress concentrates on the portion. On the contrary, in the member for the semiconductor manufacturing device 120 according to the embodiment, the boundary of the first layer 20 in the concavity 10a and the alumite base material 10 is curved and has the curvature. Thereby, the discontinuous change of the boundary of the first layer 20 in the concavity 10a and the alumite base material 10 can be suppressed and concentration of the stress can be suppressed. Therefore, the first layer 20 can be suppressed from peeling off from the alumite base material 10.

Denseness of the first region R1 and denseness of the second region R2 can be adjusted by a formation condition of the first layer 20 based on the aerosol deposition method. For example, source material powder of the aerosol sprayed to the alumite base material 10 is adjusted.

For example, the source material powder of the aerosol is obtained by mixing oxide fine particles having 50% average particle diameter of 1.0 to 5.0 µm based on volume standard (hereinafter, referred to as first fine particle) and oxide fine particles having average particle diameter of less than 1 µm based on volume standard (hereinafter, referred to as second fine particle). A ratio of mixing is the number of the first fine particle: the number of the second fine particle=1:1 to 1:100.

Each of the first fine particle and the second fine particle can be based on yttrium oxide or aluminum oxide, for example.

Since a particle diameter of the first fine particle is large, when sprayed to the alumite base material 10, impact due to the collision of the first fine particle is large. Thereby, the crystal particle is distorted and the dense layer can be formed. In this way, the first region R1 can be dense by mixing the second fine particle of a small particle diameter with the first fine particle of a large particle diameter.

As described with respect to FIG. 14 to FIG. 19, the boundary of the first layer 20 in the concavity 10a and the alumite base material 10 can be curved by using the aerosol deposition method. For example, the fine particle included in the aerosol collides with the alumite base material 10, and thus a corner of the concavity (crack) of the anode oxide coating deforms, and the boundary of the first layer 20 in the concavity 10a and the alumite base material 10 is curved.

Figure 20A:
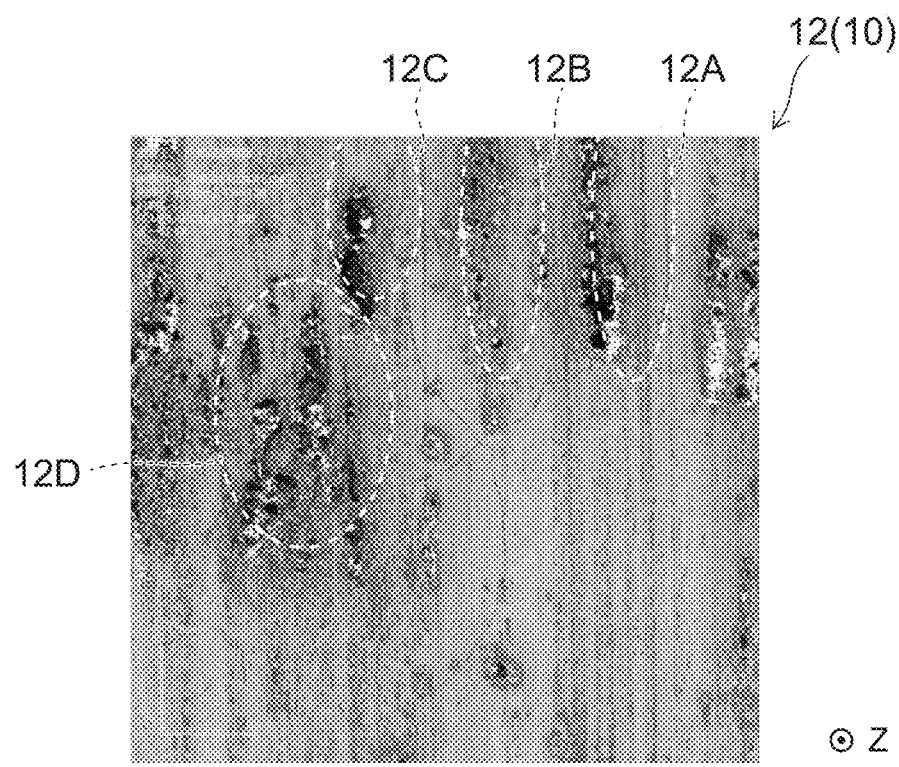
FIG. 20A and FIG. 20B are photographs illustrating the member for the semiconductor manufacturing device according to the embodiment.
Figure 20B:
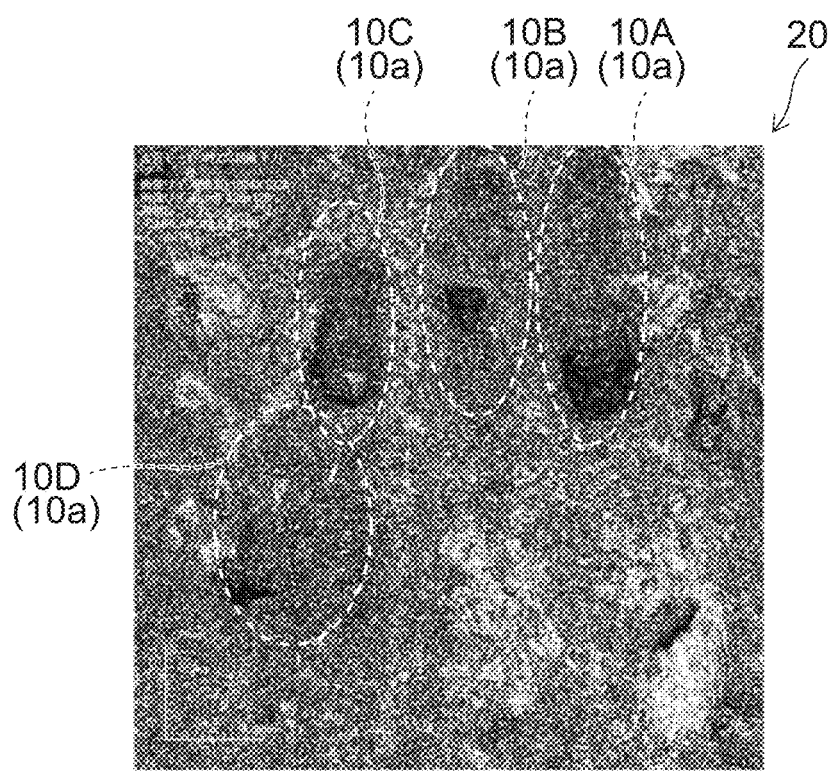

FIG. 20A and FIG. 20B are photographs illustrating the member for the semiconductor manufacturing device according to the embodiment.

FIG. 20A is a photograph showing the surface of the alumite base material 10 (the alumite layer 12) before forming the first layer 20. FIG. 20B is a photograph showing the surface of the first layer 20 after forming the first layer 20. The observation range in FIG. 20B is substantially the same as the observation range in FIG. 20A. A laser microscope (Olympus Co., LS400) is used for the observation.

As shown in FIG. 20A, concavities 12A to 12D are observed on the surface of the alumite layer 12. As shown in FIG. 20B, multiple concavities 10a (concavities 10A to 10D) are observed on the surface of the first layer 20.

The concavities 10A to 10D correspond to the concavities 12a to 12D, respectively. That is, the concavities 10A, 10B, 10C, 10D are formed by forming the first layer 20 on the concavities 12A, 12B, 12c, 12D, respectively.

Areas of the concavities 10A to 10D are larger than the areas of the concavities 12A to 12D in a plan view. For example, it is considered that the corners of the concavities of the alumite layer 12 deform by the collision of the fine particles included in the aerosol, and the concavities are enlarged. The shapes of the concavities 10a (concavities 10A to 10D) can be adjusted by the formation condition of the first layer 20 based on the aerosol deposition method. For example, the source material powder of the aerosol described above is adjusted.

Although the embodiments of the invention are described above, the invention is not limited to these descriptions. Design modification appropriately made by a person skilled in the art in regard to the embodiments described above is within the scope of the invention to the extent that the features of the invention are included. For example, the shape, the dimension, the material, the disposition or the like of the alumite base material and the first layer or the like are not limited to illustrations and can be changed appropriately.

The components included in the embodiments described above can be combined to the extent of technical feasibility and the combinations are included in the scope of the invention to the extent that the feature of the invention is included.

What is claimed is:

1. A member for a semiconductor manufacturing device, comprising:
    an alumite base material including concavitits defined therein, the concavities being irregular shaped cracks formed by heat treatment of the alumite base material; and a first layer formed by aerosol deposition on the alumite base material and including an yttrium compound, wherein the first layer including an outer surface, a first region on a side of the outer surface, and a second region provided in the concavity and located between the first region and the alumite base material, the concavity including a first portion provided with the first region and a second portion provided with the second region, a width of the second portion being narrower than a width of the first portion in a cross section along a stacking direction, and a boundary of the first layer in the concavity and the alumite base material being curved convex toward the outer surface of the first layer in the cross section.

2. The member for the semiconductor manufacturing device according to claim 1, wherein the second portion has a bottom surface along a plane perpendicular to the stacking direction, and a ratio of an opening width of the first portion to a width of the bottom surface of the second portion is not less than 1.1 times in the cross section.

3. The member for the semiconductor manufacturing device according to claim 1, wherein the first layer also has a surface contacting the alumite base material which is opposite to the outer surface, and a width of the concavity in the cross section becomes narrower as going away from the outer surface toward the surface contacting the alumite base material.

4. The member for the semiconductor manufacturing device according to claim 1, wherein an opening of each of the concavities has a first end portion and a second end portion separated from each other in the cross section, the second portion has a bottom surface along a plane perpendicular to the stacking direction, and an angle made by a straight line connecting the first end portion and the second end portion and a straight line connecting the first end portion and the bottom surface of the second portion in the shortest length in the cross section is not less than 10° and not more than 89°.

5. The member for the semiconductor manufacturing device according to claim 1, wherein a curvature radius of a boundary of the first layer in the concavity and the alumite base material is not less than 0.4 micrometers.

\* \* \* \* \*